Feb. 14, 1950 E. E. SCHROEDER 2,497,691

LIMITING AMPLIFIER SYSTEM

Filed Jan. 16, 1948 2 Sheets-Sheet 1

Inventor:
Ewald E. Schroeder,
by Merton D. Morse
His Attorney.

Feb. 14, 1950 E. E. SCHROEDER 2,497,691

LIMITING AMPLIFIER SYSTEM

Filed Jan. 16, 1948 2 Sheets-Sheet 2

Inventor:
Ewald E. Schroeder,
by Merton D. Moore
His Attorney.

Patented Feb. 14, 1950 2,497,691

UNITED STATES PATENT OFFICE 2,497,691

LIMITING AMPLIFIER SYSTEM

Ewald E. Schroeder, Berwyn, Ill., assignor to General Electric Company, a corporation of New York Application January 16, 1948, Serial No. 2,592

2 Claims. (Cl. 179—171)

Figure 1:
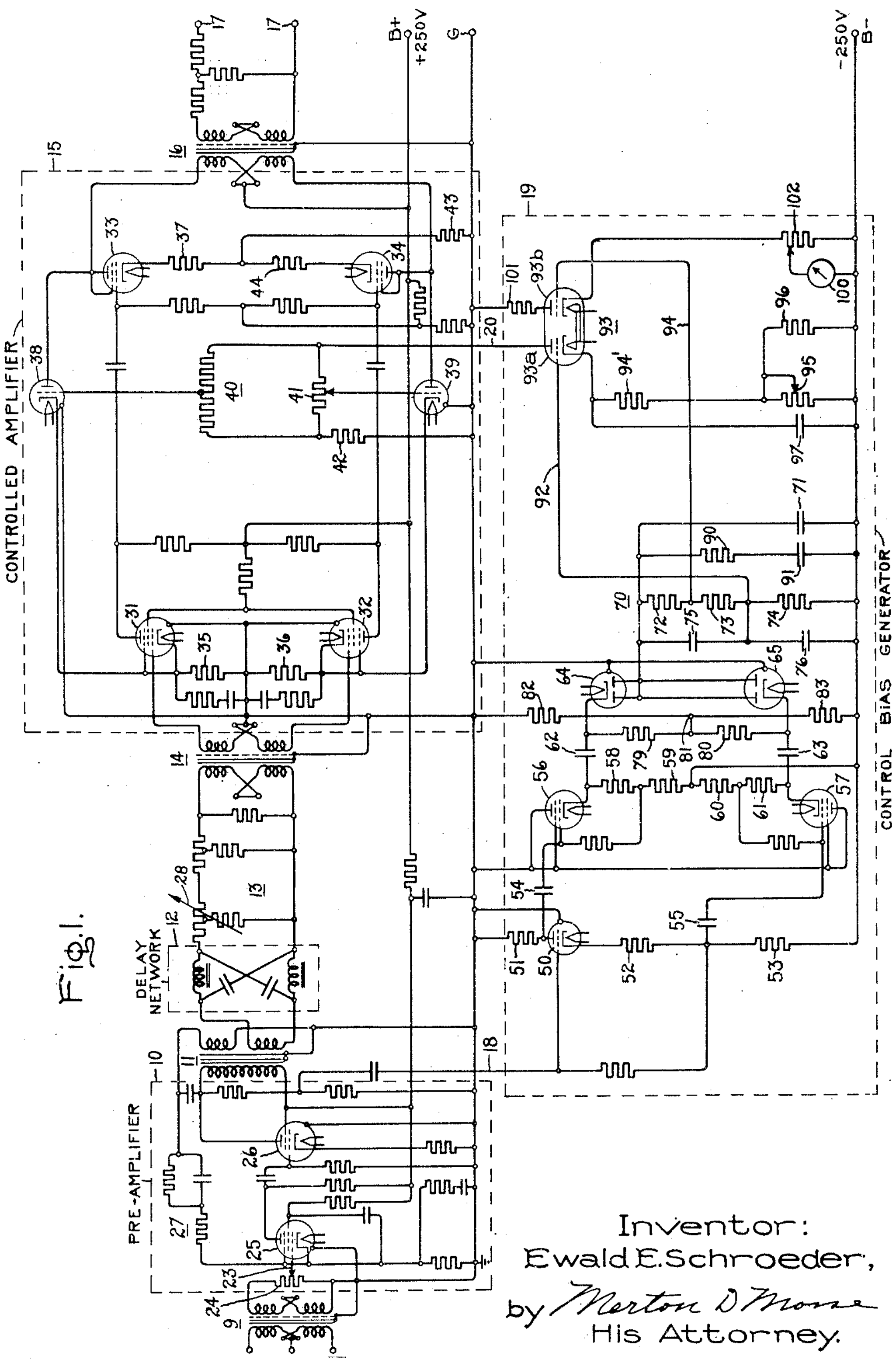

My invention relates to a limiting amplifier system and has particular utility in a peak limiting audio amplifier.

In many applications, particularly in the audio amplifier circuits of broadcast transmitters or of sound recording equipment, it is important to provide linear amplification up to a predetermined maximum amplitude level and a high degree of volume compression without loss in fidelity for all signals exceeding this level. It is a primary object of my invention to provide an improved amplifying system of this type which closely realizes these objectives and which prevents audible "thumps" or "clicks" from appearing in the output signals in response to sudden input signal peaks exceeding the desired level.

It is also an object of my invention to provide an improved limiting amplifier system which is very fast-acting, which provides a high compression in modulation level above a desired limiting threshold level, and which is characterized by very low waveform distortion both under transient and steady-state conditions.

In prior art limiting amplifiers, difficulty has generally been encountered on certain types of program material due to the phenomenon known as "pumping." In order to prevent a noticeable reduction in gain in an audio signal below the limiting level which immediately follows such a high-intensity peak or signal of high level, the system must have a fairly fast gain recovery time. If the input signal contains a series of closely-spaced high-intensity peaks there will therefore tend to be produced a relatively rapid shifting of gain, or "pumping." This is especially noticeable when a series of words are spoken against an applause background. The up and down effect of the gain reduction upon the relatively steady applause background is then most annoying. It is therefore desirable to provide a system having a gain recovery characteristic which is automatically varied with the type of program material. Specifically, the recovery time should be automatically increased in the presence of repeated overmodulation peaks in order to reduce the variation and gain between peaks. It is therefore another object of my invention to provide an improved peak limiting audio amplifier in which the gain recovery time is made an automatic function of the characteristics of the program signal so as to reduce "pumping" effects.

For additional objects and advantages, and for a better understanding of the invention, attention is now directed to the following description and accompanying drawings, and also to the appended claims in which the features of the invention believed to be novel are particularly pointed out.

Figure 2:
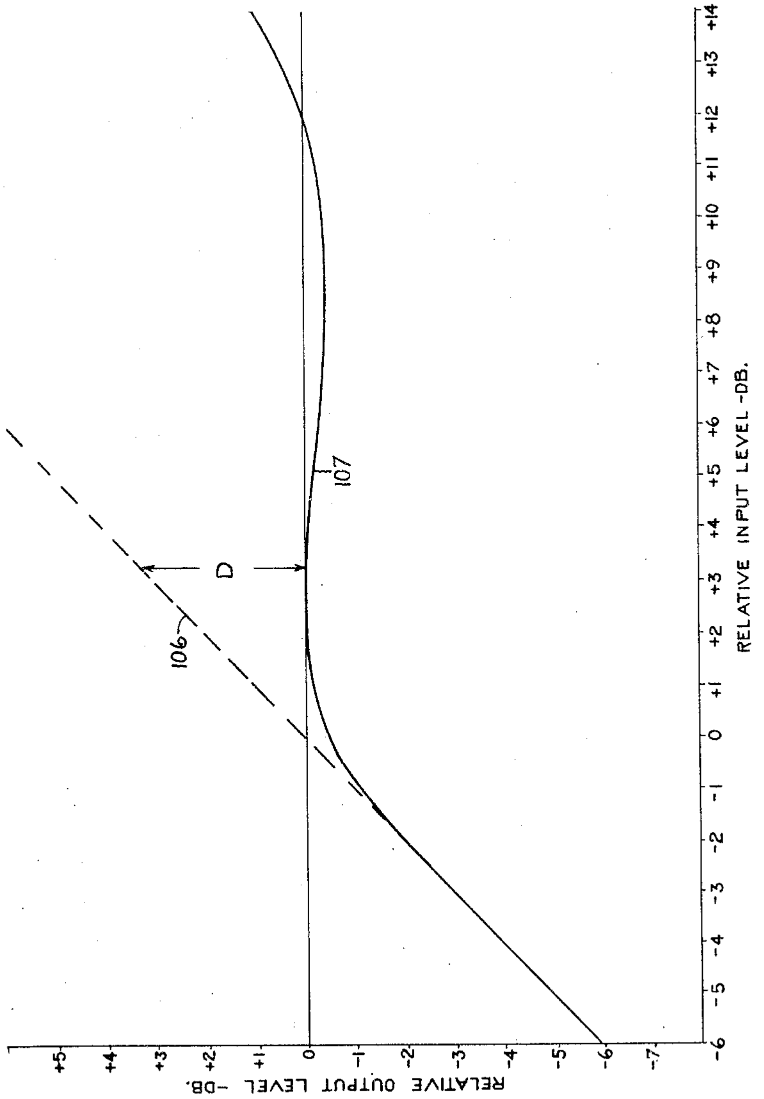

In the drawings:

Fig. 1 is a schematic circuit diagram of a limiting amplifier system embodying the invention; and Fig. 2 is a graph illustrating certain gain limiting characteristics of the circuit of Fig. 1.

Referring now particularly to Fig. 1, the major elements of the limiting amplifier system are represented within dashed rectangles. Input audio signals are supplied through transformer 9 from any suitable audio source, not shown, to a preamplifier 10. Amplified signals are coupled through transformer 11 to the input of a signal delay network 12. The delayed signals are then supplied through an attenuator network 13 and a transformer 14 to a controlled amplifier 15, in which the gain limiting action occurs in a manner shortly to be described. The output of amplifier 15 is then coupled through a transformer 16 to the pair of output terminals 17 which are connected to any suitable load circuit, not shown. For example, the load circuit may comprise the modulator of a broadcast transmitter or a sound recording apparatus. The output of pre-amplifier 10 is also coupled directly over conductor 18 to a control bias generator 19. Generator 19 contains circuits for developing gain limiting control potentials which are applied to control amplifier 15 over conductor 20. Suitable operating potentials for the pre-amplifier 10 and control amplifier 15 are supplied from a unidirectional source, not shown, between a positive bus B+ and a common bus G, which may be grounded as shown. Operating potentials for the elements of the control bias generator 19 are also conventionally represented as being supplied from a bus B— energized with a negative unidirectional potential with respect to the common ground bus G. The power supplies should preferably be well-regulated.

Having thus generally described the major components of the limiting amplifier system, the detailed circuit arrangement will now be considered. Pre-amplifier 10 may be any suitable audio amplifier known to the art. As represented, it comprises two resistance-coupled stages 25 and 26. The amplitude of the input signals supplied to stage 26 may be adjusted by moving tap 23 on potentiometer 24, which is connected across the secondary of transformer 9. In accordance with preferred practice, a certain amount of degenerative feedback is supplied from the output of stage 26 to the input of stage 25 through network 27 in order to improve the stability of the amplifier and the fidelity of reproduction. The purpose of the pre-amplifier 10 is to raise the level of the input signal, which may be supplied from a very low-level source such as microphone or sound recording head, to a level sufficient to supply both the controlled amplifier 15 and the control bias generator 19.

The delay network 12 may also be of any suitable conventional design, and is represented as a lattice network. The audio signal voltage is delayed by the network 12 and the input level to the controlled amplifier 15 may be independently adjusted by means of a variable element of attenuator 13, represented conventionally by arrow 28.

The controlled amplifier 15 is a two-stage, push-pull amplifier comprising a pair of electron discharge devices 31 and 32 in the input stage and a pair of electron discharge devices 33 and 34 in the output stage. The two stages are resistance-coupled in conventional manner and it is believed that the circuit connections and the manner of applying operating potentials will be obvious to those skilled in the art without detailed explanation. A certain amount of degeneration is provided by utilizing unbypassed cathode resistors 35, 36 and 37, 44, 43 in the respective stages.

Amplifier 15 is given a variable gain characteristic by utilizing a variable amount of degenerative voltage feedback between the two stages. The feedback paths comprise a pair of triode discharge devices 38 and 39 each having its anode connected to the anode of one of the output devices 33, 34 and its cathode connected to the cathode of a corresponding one of the devices 31, 32. The control grids of the devices 38 and 39 are connected to ground through portions of potentiometers 40 and 41, respectively, and common resistor 42. Control bias potentials, developed in control bias generator 19 in a manner to be described below, are impressed upon potentiometers 40 and 41, in parallel, over conductor 20. The anode-to-cathode impedances of devices 38, 39 are thereby controlled. This in turn varies the amount of feedback from the output to the input stage of amplifier 15 and thus its over-all gain. The connection from potentiometer 41 to control grid of device 39 is preferably made adjustable, as illustrated, for balancing purposes.

Undelayed audio signals from the output of pre-amplifier 10 are supplied over conductor 18 to the control grid of a triode discharge device 50. Device 50 is connected in a phase-inverter circuit, its anode being connected to ground through resistor 51 and its cathode being connected to B— through resistors 52 and 53. Resistor 52 provides a certain amount of degeneration to improve circuit stability. Push-pull output signals appearing across resistors 51 and 53 are supplied through coupling capacitors 54 and 55 to the control grids of a pair of discharge devices 56 and 57. The anodes of devices 56 and 57 are connected to ground and the cathodes are connected to B— through load resistors 58, 59 and 60, 61 respectively. The devices are triode-connected and the signal output is taken from their cathodes and supplied through blocking capacitors 62 and 63 to a full-wave rectifier comprising a pair of diodes 64, 65. Thus, the devices 56, 57 provide a suitable low-impedance charging source for the diodes 64, 65.

Full-wave rectification of the audio signals takes place in diodes 64, 65 and a control bias potential is developed across the diode load network 70. A primary component of the network 70 is a diode load capacitor 71, connected from the anodes of diodes 64 and 65 to B— and shunted by resistors 72, 73 and 74 in series. Capacitors 75 and 76, in shunt to resistors 72, 73 and resistor 74 respectively, are small audio bypass capacitors.

A positive delay bias is impressed upon the cathode of diodes 64, 65 through resistors 79 and 80, respectively. This potential is supplied from point 81 on a voltage divider network comprising resistors 82 and 83 connected across the power supply buses. This bias potential determines the threshold limiting level of the amplifier for any given input signal level, since diodes 64, 65 cannot conduct until the applied audio signals exceed this level.

For reasons that will shortly appear, the diode load network 70 also includes a resistor 90 and capacitor 91 serially connected across the diode load resistors 72, 73, 74. This series circuit connection forms an "anti-pump" circuit, as will become shortly apparent.

A portion of the control bias voltage, appearing across resistor 74, is impressed over conductor 92 on the left-hand control grid of duo-triode discharge device 93 having a left-hand section 93a and a right-hand section 93b. Another portion of this control bias potential, appearing across resistors 73 and 74, is similarly supplied over a conductor 94 to the right-hand control grid of section 93b. Section 93a and its associated circuits operate as a polarity inverter in order to obtain a control voltage of the correct polarity for application to the control grids of the feedback control devices 38 and 39. It will be observed that the anode of section 93a is connected to ground through the parallel resistors 40 and 41 and common resistor 42. The cathode is connected to B— through a network comprising resistor 94′ in series with an adjustable resistor 95 and a parallel resistor 96, these resistors all being shunted by a capacitor 97. As will be discussed more fully later, this network not only provides an operating grid bias for section 93a but also performs an important function in suitably shaping the voltage pulses applied to the controlled amplifier 15.

The right-hand section 93b of discharge device 93 is connected in a circuit to indicate the degree of gain-reduction upon a calibrated VU meter 100. The anode of section 93b is connected to ground through resistor 101 and the cathode is connected to B— through potentiometer 102. The meter 100 measures a portion of the current in resistor 102.

The operation and adjustment of the system may best be understood by first considering that signals within the audio frequency band, e. g., from about 30 to 15,000 cycles per second, are impressed upon input transformer 10 and that these signals do not exceed the delay bias level in the control bias generator 19. Under these conditions rectifiers 64 and 65 are non-conductive and section 93a of the output stage in control bias generator 19 draws a certain normal value of anode current, and thereby provides a certain grid bias voltage for feedback control devices 38 and 39. This in turn results in a predetermined gain through controlled amplifier 15, which may be considered the normal gain of the system.

Assume now that a single sharp signal peak occurs which overcomes the threshold limiting level. The full-wave rectifier 64, 65 now draws current through its low-impedance driving source and charges capacitor 71. This charging action may be made extremely fast, if the driving impedance is kept low through the use of cathode-coupled output circuits for tubes 56 and 57 and the use of power-type amplifiers for these tubes. In other words the time constant of the charging network for capacitor 71 is made very fast (of the order of microseconds) so that a sudden overmodulation peak causes a control voltage pulse of relatively steep wavefront to be impressed upon the control grid of amplifier section 93a. The polarity of this control voltage pulse is such as to render the control grid of section 93a more negative with respect to ground, thereby decreasing the anode current and increasing the potentials impressed on the control grids of devices 38 and 39. Consequently, the amount of negative feedback between the two stages of the control amplifier 15 is increased, reducing its gain.

The rate of change of anode current in section 93a, in the presence of such a control bias pulse of steep wavefront, is also determined by the time constant of network 94, 95, 96, 97. The dynamic characteristic may be adjusted over a predetermined range by adjusting resistor 95, which may be termed the "slope control." Since the anode load network, comprising resistors 40, 41 and 42, is substantially non-reactive, it has very little effect on the wave shape.

Capacitor 97 further provides a low cathode impedance for section 93a at the time of initial application of bias voltage, and therefore increased gain for section 93a during the rise time of the pulse. The bias voltage applied to devices 38 and 39 is therefore initially increased in the presence of transients of steep wavefront, increasing the speed of the control action considerably.

By proper adjustment of the circuit constants and operating voltages, the gain-reducing action in the controlled amplifier 15 may be made inherently as fast, or faster than, that of control bias generator 19.

The anti-pump circuit comprising capacitor 91 and resistors 90, 72, 73 and 74 is proportioned so that capacitor 91 is not appreciably charged during a single short modulation peak. This is accomplished by employing a relatively high resistance value for resistor 90, of the order of several megohms. The sum of resistors 72, 73 and 74 is also proportioned with respect to capacitor 71 so as to provide a discharge circuit for capacitor 71 of desired time constant at the end of the pulse. It is desirable to make this time constant relatively short so as to restore the original amplifier gain fairly rapidly after a modulation peak, though not so short as to cause waveform distortion. The time constant of this network upon discharge may for example be of the order of .2 to .4 second. This corresponds to the period of a very low frequency below the lower limit of the audio frequency band but is still sufficiently fast to avoid depressing the gain of the system for an appreciable period following the modulation peak.

Now, if several high signal peaks of short duration occur during a short interval, the capacitor 91 as well as capacitor 71 will become charged, causing gain reduction as before. Following this series of peaks, the initial rate of gain recovery will be nearly as fast as the recovery following a single peak up to approximately 40% of the total gain recovery. This follows from the logarithmic discharge characteristics of the networks, providing an initial high rate of discharge in either case. When the ratio of the potential on capacitor 71 to that on capacitor 91 is equal to the ratio of the sum of resistors 72, 73, 74 to the sum of resistors 72, 73, 74, 90, the remaining recovery time will be determined by the discharge characteristics of the anti-pump circuit. As previously mentioned, the discharge time constant of this network is preferably of the order of several seconds, for example 6–10 seconds. It can thus be seen that when a series of short signal peaks occur in rapid succession, the anti-pump circuit will be effective to limit the amount of gain recovery between peaks, thereby reducing the pumping effect. A similar effect will be produced in the event of a sustained signal peak of high amplitude which causes both the capacitors 71 and 91 to be charged. The advantage of the lengthened recovery time for these conditions is that less dynamic range will be lost and the effects due to signal compression will be less apparent to the listener than might otherwise be expected.

Fig. 2 illustrates the volume compression characteristics of the amplifier of Fig. 1, based upon experimental data. Relative output signal level in decibels is plotted as ordinates against relative input signal level in decibels as abscissa. The characteristics for an amplifier having constant gain are represented by the dashed line 106. The gain reduction in decibels at any particular signal input level is then the vertical distance D between this dashed line and the solid line curve 107 representing the actual limiting amplifier characteristics. It will be seen that the system embodying my invention provides a very high order of compression ratio within the operating range. As is evident from Fig. 2, the output level is held constant within .5 db. for an input level increase of 12 db. above the threshold value.

The time delay of the audio signals in passing through network 12 is made just long enough so that the fast-acting control bias generator reduces the gain of control amplifier 15 before the input signals are impressed upon amplifier 15. In this way, no voltages exceeding a predetermined value can appear at the amplifier output under any conditions, even on very high modulation transients of steep wavefront.

The threshold limiting level may readily be changed by adjusting tap 23 on potentiometer 24. This varies the signal input level of both controlled amplifier 15 and control bias generator 19. The gain of amplifier 15 may then be separately adjusted to secure any desired gain characteristic within the operating range by readjusting variable attenuator element 28.

Merely by way of illustration, the following are some of the more significant circuit constants which have been found to be suitable in the control bias generator 19:

Tube 50: Type 6J5
Tubes 56, 57: Type 6Y6
Tubes 64, 65: Type 6X5
Tube 93: Type 6SN7
Capacitors 62, 63=2 mfd.
Capacitor 75=.001 mfd.
Capacitor 76=.0039 mfd.
Capacitor 91=.1 mfd.
Capacitor 71=.02 mfd.
Capacitor 97=.05 mfd.
Resistors 58, 61=1000 ohms
Resistors 59, 60=3500 ohms
Resistor 72=3.3 megohms
Resistor 73=4.7 megohms
Resistor 74=2.0 megohms
Resistors 79, 80=20,000 ohms
Resistor 82=48,000 ohms
Resistor 83=1,600 ohms
Resistor 94=4,700 ohms
Resistor 95=3,300 ohms (variable)
Resistor 96=3,900 ohms Another important advantage of my improved limiting amplifier system is the low waveform distortion both under transient and steady-state conditions. It is well known that the distortion of an amplifier is decreased with an increased amount of negative feedback. Since the effect of over-modulation is to increase the negative feedback, the signal distortion in amplifier 15 is actually reduced as the signal input level increases above the threshold limiting value.

While a certain specific embodiment has been shown and described, it will of course be understood that various modifications may be made without departing from the invention. The appended claims are therefore intended to cover any such modifications within the true spirit and scope of the invention.

What I claim as new and desire to secure by Letters Patent of the United States is:

1. A limiting amplifier system comprising, in combination, an audio frequency signal input circuit, a signal delay network, a multi-stage audio amplifier having an input coupled to said circuit through said network, a degenerative feedback path between two stages of said amplifier, said path including the anode-to-cathode impedance of a grid-controlled discharge device, a control bias generator having an input supplied directly from said input circuit and comprising a low-impedance signal rectifying device and a capacitance-resistance load network, means for biasing said rectifying device to non-conductive condition until applied audio frequency signals exceed a predetermined level, said load network being charged through said rectifying device to provide a bias voltage in response to audio signals exceeding said level, said network having a short time constant on charge and a long time constant on discharge relative to the period of a low audio frequency signal, an anti-pump network comprising a series resistor and capacitor connected in shunt to said load network and having a time constant substantially longer than said discharge time constant, and means for reducing the impedance of said grid-controlled discharge device in response to said bias voltage, said delay network providing a time delay greater than the time required for said control bias generator to cause said impedance to decrease.

2. A peak limiting amplifying sytem comprising, in combination, a source of audio frequency signals, a signal delay network, a multi-stage audio amplifier coupled to said source through said network, a degenerative feedback network between two stages of said amplifier including the anode-to-cathode path of a variable impedance device having a control electrode, a series peak detector having an input circuit supplied with undelayed audio signals from said source and comprising a diode and a capacitor in series, said input circuit having a very short time constant relative to the period of an audio frequency signal during charging of said capacitor through said diode, a first resistor in shunt to said capacitor and forming therewith an output circuit having a discharge time constant of the order of 0.3 second, an anti-pump circuit comprising a second resistor and a second capacitor connected in series across said first resistor and forming therewith a network having a relatively long time constant of the order of several seconds, and means for impressing unidirectional control potentials responsive to the potential across said output circuit on said control electrode.

EWALD E. SCHROEDER.

REFERENCES CITED

The following references are of record in the file of this patent:

UNITED STATES PATENTS

| Number | Name | Date |
|---|---|---|
| 1,925,608 | Round | Sept. 5, 1933 |
| 2,244,695 | Hathaway | June 10, 1941 |
| 2,283,241 | Van Cott | May 19, 1942 |
| 2,343,207 | Schrader et al. | Feb. 29, 1944 |